(12) United States Patent
Yu et al.

(10) Patent No.: US 9,691,788 B2
(45) Date of Patent: Jun. 27, 2017

(54) DISPLAY DEVICE

(71) Applicant: Samsung Display Co., Ltd., Yongin, Gyeonggi-Do (KR)

(72) Inventors: Ha Won Yu, Suwon-si (KR); Hyun Ho Kang, Ansan-si (KR); O Sung Seo, Seoul (KR); Seung Jun Yu, Suwon-si (KR); Ki Kyung Youk, Bucheon-si (KR); Yeo Geon Yoon, Suwon-si (KR); Sang Myoung Lee, Seoul (KR); Tae Kyung Yim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/682,492

(22) Filed: Apr. 9, 2015

(65) Prior Publication Data

US 2016/0109768 A1  Apr. 21, 2016

(30) Foreign Application Priority Data

Oct. 16, 2014 (KR) .................... 10-2014-0139793

(51) Int. Cl.
*G02F 1/1343* (2006.01)
*G02F 1/1333* (2006.01)
*G02F 1/1337* (2006.01)
*G02F 1/1368* (2006.01)
*H01L 27/12* (2006.01)

(52) U.S. Cl.
CPC .... *H01L 27/1225* (2013.01); *G02F 1/133753* (2013.01); *G02F 1/134309* (2013.01); *G02F 1/133707* (2013.01); *G02F 2001/133742* (2013.01); *G02F 2001/133757* (2013.01); *G02F 2001/134345* (2013.01); *G02F 2001/134354* (2013.01)

(58) Field of Classification Search
None
See application file for complete search history.

(56) References Cited

U.S. PATENT DOCUMENTS

| 2010/0296015 | A1* | 11/2010 | Kim | G02F 1/134309 |
| | | | | 349/37 |
| 2012/0044448 | A1* | 2/2012 | Kim | G02F 1/13439 |
| | | | | 349/141 |
| 2012/0168058 | A1* | 7/2012 | Kim | B29D 11/0073 |
| | | | | 156/101 |
| 2013/0083263 | A1* | 4/2013 | Kim | G02F 1/134336 |
| | | | | 349/38 |
| 2013/0088667 | A1* | 4/2013 | Kong | G02F 1/133528 |
| | | | | 349/96 |
| 2013/0201430 | A1 | 8/2013 | Fan et al. | |

FOREIGN PATENT DOCUMENTS

| KR | 1020090103461 A | 10/2009 |
| KR | 1020100089248 A | 8/2010 |
| KR | 1020130025066 A | 3/2013 |

* cited by examiner

*Primary Examiner* — Khaja Ahmad
(74) *Attorney, Agent, or Firm* — Innovation Counsel LLP

(57) ABSTRACT

A display device according to an exemplary embodiment includes: a first insulation substrate; a thin film transistor disposed on the first insulation substrate; and a pixel electrode coupled to the thin film transistor. The pixel electrode includes a first subpixel electrode that is divided into two regions configured to arrange liquid crystal molecules while including one first horizontal stem portion, and a second subpixel electrode that includes a plurality of second horizontal stem portions.

15 Claims, 16 Drawing Sheets

DISPLAY DEVICE

CROSS-REFERENCE TO RELATED APPLICATION

This application claims priority to and the benefit of Korean Patent Application No. 10-2014-0139793 filed in the Korean Intellectual Property Office on Oct. 16, 2014, the entire contents of which are incorporated herein by reference.

BACKGROUND (a) Field

The present application relates to a display device.

(b) Description of the Related Art

As one of the most widely used displays at present, a liquid crystal display (LCD) include two display panels on which field generating electrodes such as a pixel electrode and a common electrode are formed, and a liquid crystal layer interposed between the two display panels.

The LCD displays an image by applying a voltage to the field generating electrodes to generate an electric field on a liquid crystal layer; determining alignment directions of liquid crystal molecules of the liquid crystal layer through the generated field, and controlling polarization of incident light.

A size of the LCD is becoming larger since it is used as a display of al television receiver.

As the size of the LCD becomes larger, a significant visual difference is observed by a viewer depending on whether a center portion or left/right ends of a screen is viewed.

To compensate for such a visual difference therebetween, the display device can be concavely or convexly curved, thereby forming a curved display.

Based on the viewer, the display device may be a portrait type of display device with its vertical length longer than its horizontal length that is curved in a vertical direction, or a landscape type of display device with its vertical length shorter than its horizontal length that is curved in a horizontal direction.

However, when the LCD is curvedly formed as a curved display, a sheering stress is applied to, in particular, an inner one of the two substrates, thereby causing texture and decreased luminance due to misalignment of upper and lower substrates.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a display device that is capable of improving display abnormalities occurring in a curved display device by changing shapes and arrangements of pixel electrodes.

In addition, embodiments have been made in an effort to provide a display device for controlling texture generation even if a size of a unit pixel area is decreased for high resolution.

An exemplary embodiment provides a display device including: a first insulation substrate; a thin film transistor disposed on the first insulation substrate; and a pixel electrode coupled to the thin film transistor. The pixel electrode includes a first subpixel electrode that is divided into two regions configured to arrange liquid crystal molecules while including one first horizontal stem portion, and a second subpixel electrode that includes a plurality of second horizontal stem portions.

The first and second subpixel electrodes may respectively include a plurality of minute branch portions that diagonally extend from the first and second horizontal stem portions.

Some of the minute branch portions extending from the plurality of second horizontal stem portions may be connected to each other.

The second subpixel electrode may include two second horizontal stem portions.

The first subpixel electrode may include a first vertical stem portion that is disposed at one end of the first horizontal stem portion, and the second subpixel electrode may include a second vertical stem portion that is disposed at one end of the second horizontal stem portions.

The first vertical stem portion disposed at an n-th column and the first vertical stem portion disposed at an (n+1)-th column may be symmetrical to each other.

The n may be a natural number of 1 or more.

The first vertical stem portion disposed at an n-th column and the first vertical stem portion disposed in an (n+1)-th column may be disposed at the same side.

The n may be a natural number of 1 or more.

The first and second vertical stem portions adjacent in one pixel area may be alternately disposed.

The first and second vertical stem portions adjacent in one pixel area may be disposed parallel to each other.

The second vertical stem portion disposed at an n-th row and the first vertical stem portion disposed at an (n+1)-th row may be alternately disposed.

The n may be a natural number of 1 or more.

The second vertical stem portion disposed at an n-th row and the first vertical stem portion disposed at an (n+1)-th row may be disposed parallel to each other.

The n may be a natural number of 1 or more.

The thin film transistor may include: a gate line that is disposed on the first insulation substrate while including a gate electrode; a semiconductor layer disposed on the gate line; a data line including a source electrode; and a drain electrode wherein the source and drain electrodes are disposed on the semiconductor layer.

The display device may further include a gate insulating layer disposed on the gate line, and a passivation layer disposed on the data line and the drain electrode.

The display device may further include a color filter and a light blocking member that are disposed on the second insulation substrate.

The display device may be a curved type.

The second subpixel electrode may be divided into four regions configured to arrange liquid crystal molecules.

According to the display device described above, even if the display device is curved, display abnormalities due to misalignment of upper and lower substrates can be improved.

In addition, the texture generated due to reduction in the pixel area for the high resolution can also be improved.

DETAILED DESCRIPTION OF THE EMBODIMENTS

Figure 1:
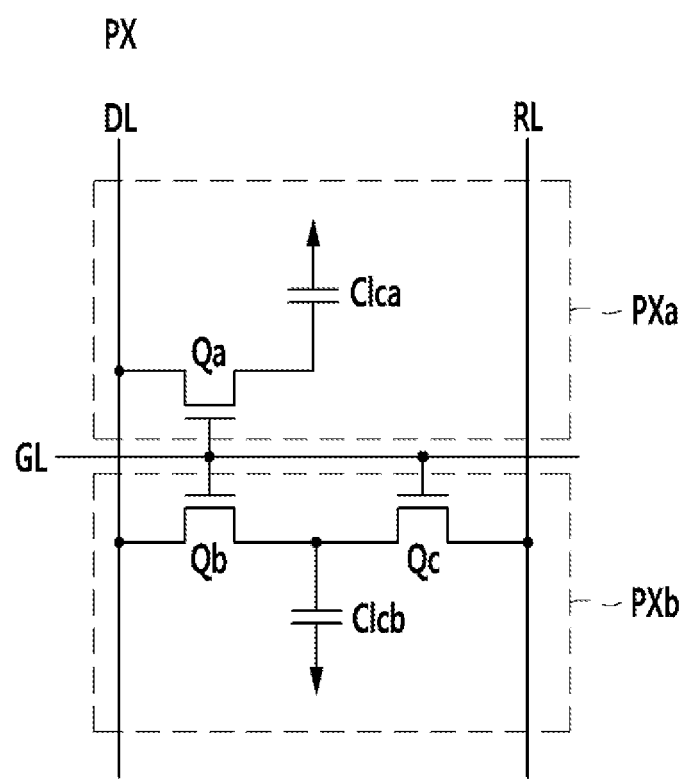
FIG. 1 is a circuit diagram of one pixel according to an exemplary embodiment.

The inventive concept will be described more fully hereinafter with reference to the accompanying drawings, in which exemplary embodiments are shown.

As those skilled in the art would realize, the described embodiments may be modified in various different ways, all without departing from the spirit or scope of the inventive concept.

In the drawings, the thickness of layers, films, panels, regions, etc. are exaggerated for clarity.

Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

A display device according to an exemplary embodiment will now be described with reference to FIGS. 1 to 5.

Figure 2:
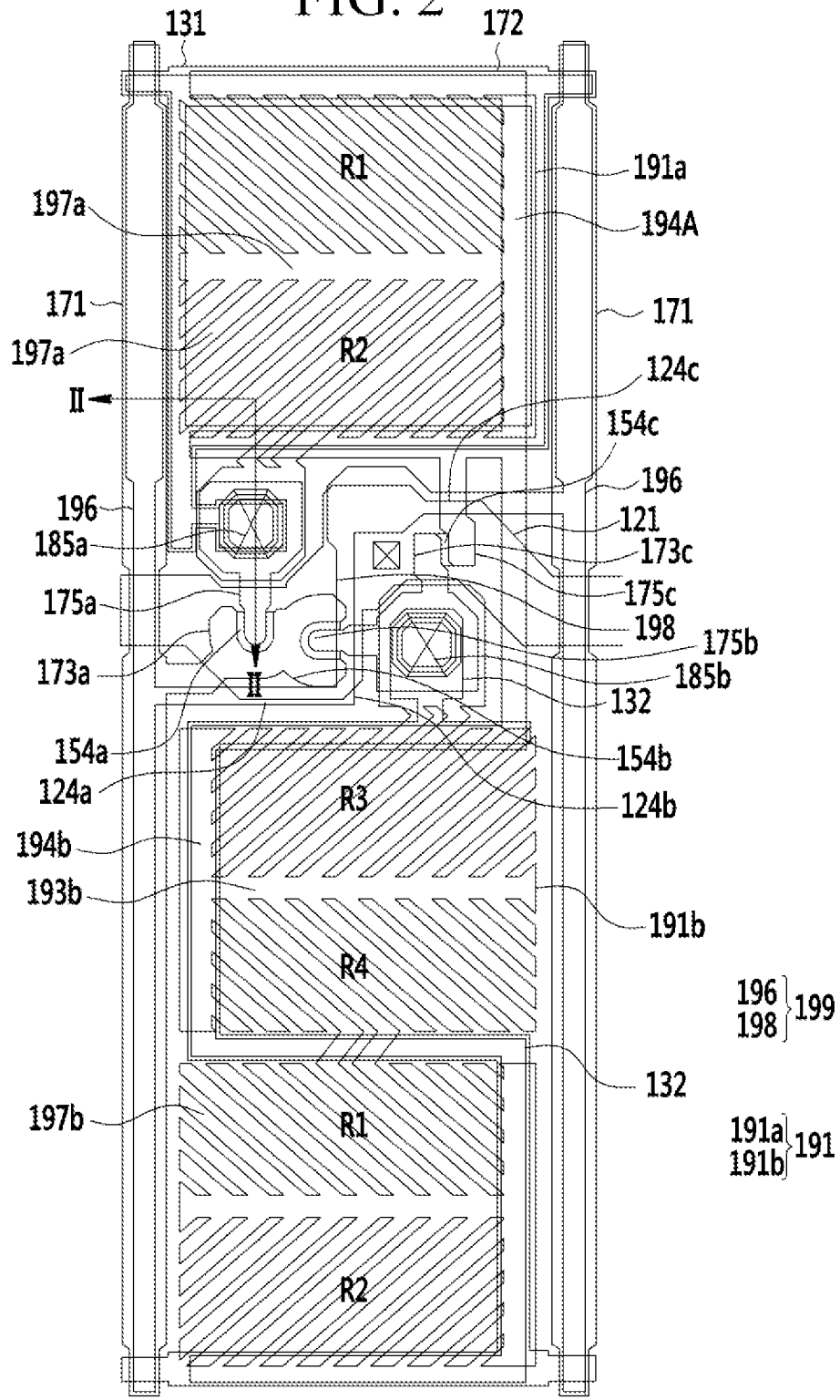
FIG. 2 is a planar layout view of one pixel area according to the exemplary embodiment.
Figure 3:
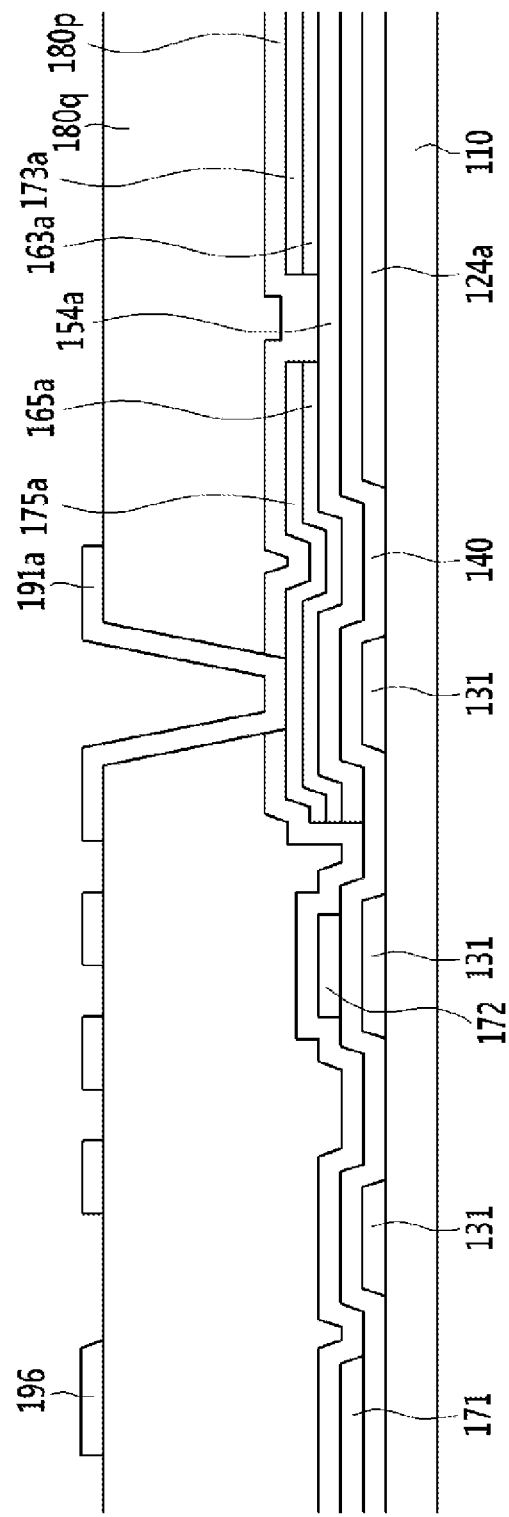
FIG. 3 is a cross-sectional view of FIG. 2 taken along the line II-II.
Figure 4:
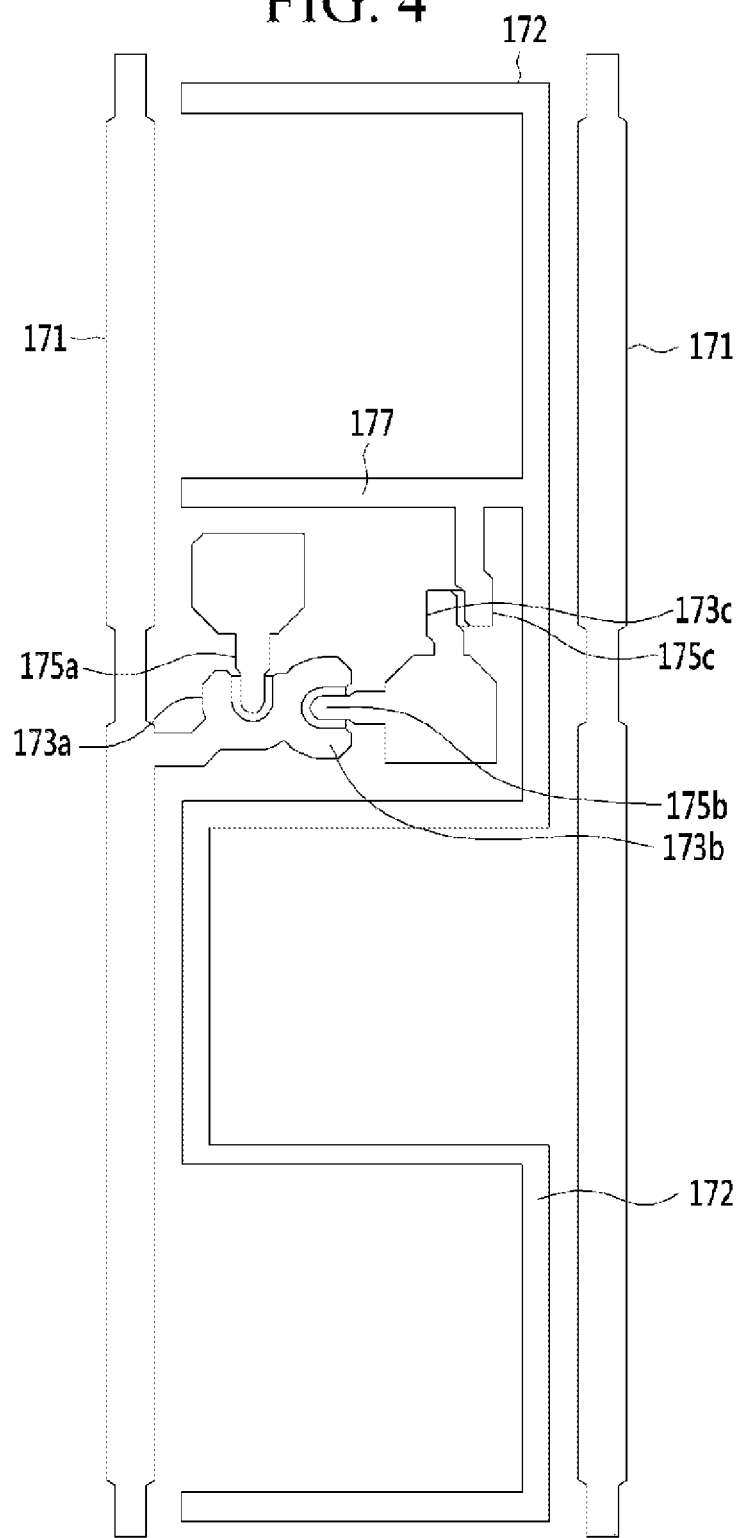
FIG. 4 is a top plan view of a data conductor layer of FIG. 2.
Figure 5:
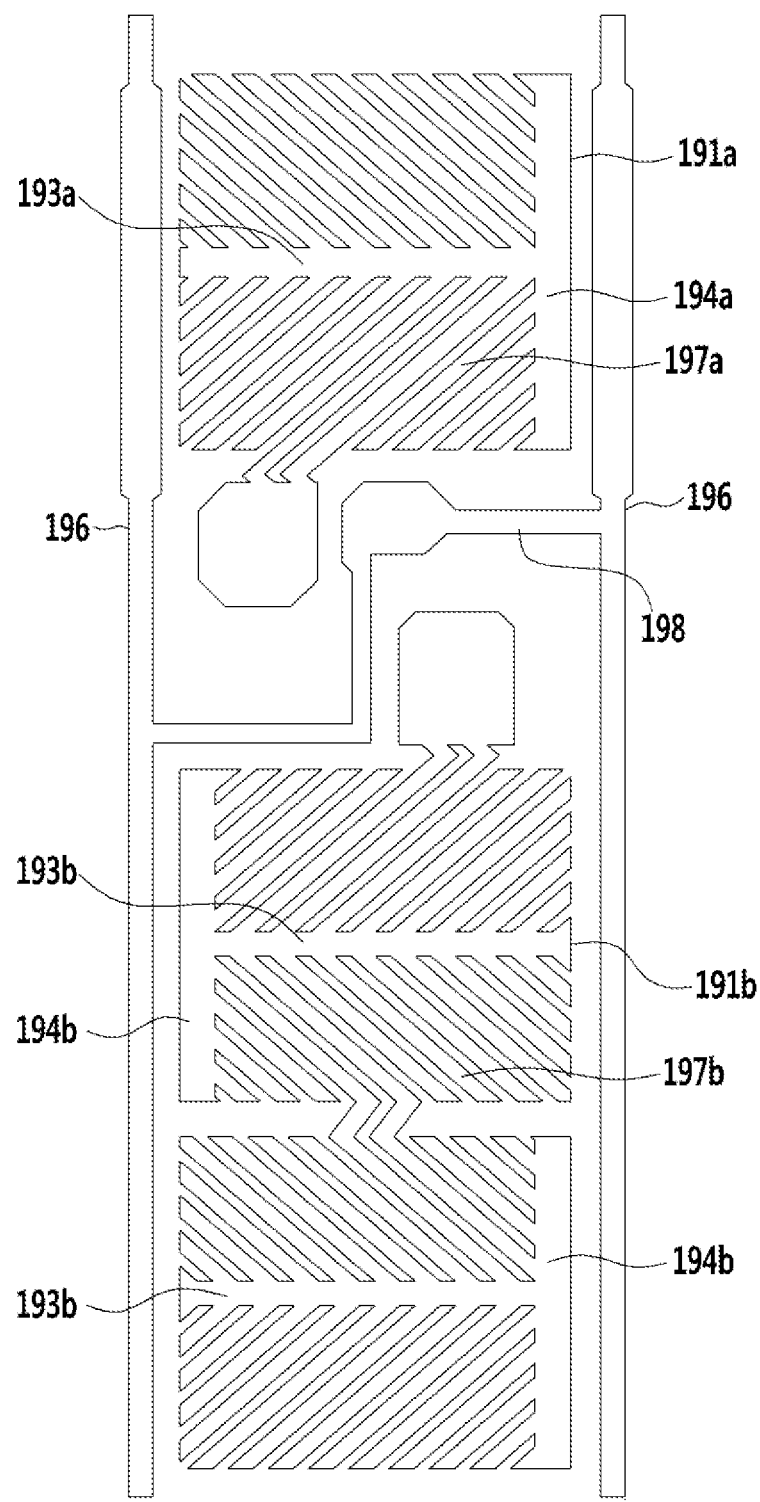
FIG. 5 is a top plan view of a pixel electrode layer of FIG. 2.

FIG. 1 is a circuit diagram of one pixel according to an exemplary embodiment; FIG. 2 is a planar layout view of one pixel area according to the exemplary embodiment, FIG. 3 is a cross-sectional view of FIG. 2 taken along the line II-II, FIG. 4 is a top plan view of a data conductor layer of FIG. 2, and FIG. 5 is a top plan view of a pixel electrode layer of FIG. 2.

Referring first to FIG. 1, one pixel PX of the display device according to the present exemplary embodiment includes: a plurality of signal lines including a gate line GL for transmitting a gate signal, a data line DL for transmitting a data signal, and a divided reference voltage line RL for transmitting a divided reference voltage; and first, second, and third switching elements Qa, Qb, and Qc and first and second liquid crystal capacitors Clca and Clcb coupled to the plurality of signal lines.

The first and second switching elements Qa and Qb are respectively coupled to the gate line GL and the data line DL, and the third switching element Qc is coupled to an output terminal of the second switching element Qb and the divided reference voltage line RL.

The first and second switching elements Qa and Qb are three-terminal elements such as a thin film transistor and the like, control terminals thereof are coupled to the gate line GL, and input terminals thereof are coupled to the data line DL. An output terminal of the first switching element Qa is coupled to the first liquid crystal capacitor Clca. The output terminal of the second switching element Qb is coupled to the second liquid crystal capacitor Clcb and an input terminal of the third switching element Qc.

The third switching element Qc is also a three-terminal element such as thin film transistor and the like, a control terminal thereof is coupled to the gate line GL, the input terminal thereof is coupled to the second liquid crystal capacitor Clcb, and an output terminal thereof is coupled to the divided reference voltage line RL.

When a gate-on signal is applied to the gate line GL, the first switching element Qa, the second switching element Qb, and the third switching element Qc coupled thereto are turned on.

Thus, a data voltage applied to the data line DL is applied to a first subpixel electrode PXa and a second subpixel electrode PXb through the turned-on first and second switching elements Qa and Qb.

In this case, the data voltages applied to the first and second subpixel electrodes PXa and PXb are identical to each other, and the first and second liquid crystal capacitors Clca and Clcb are charged with the same amount of charges corresponding to a difference between a common voltage and the data voltage.

Simultaneously, a voltage charged to the second liquid crystal capacitor Clcb is divided by the turned-on third switching element Qc.

Accordingly, the voltage charged in the second liquid crystal capacitor Clcb is decreased by a difference between the common voltage and the divided reference voltage.

That is, a voltage charged in the first liquid crystal capacitor Clca is higher than the voltage charged in the second liquid crystal capacitor Clcb.

As such, the voltages charged to the first and second liquid crystal capacitors Clca and Clcb are different from each other.

Since the voltages of the first and second liquid crystal capacitors Clca and Clcb are different from each other, tilt angles of liquid crystal molecules of the first and second subpixels are different, thereby obtaining the two subpixels of different luminances.

Accordingly, when the voltages of the first and second liquid crystal capacitors Clca and Clcb are appropriately adjusted, an image viewed from the front is as close as possible to an image viewed from a side, thereby improving side visibility.

In order for the voltages charged in the first and second liquid crystal capacitors Clca and Clcb to be different from each other, the exemplary embodiment is illustrated to include the third switching element Qc that is coupled to the second liquid crystal capacitor Clcb and the divided reference voltage line RL, but in the case of an LCD according to another exemplary embodiment, the second liquid crystal capacitor Clcb may be connected to a step-down capacitor.

Specifically, by including a third switching element including a first terminal coupled to a step-down gate line, a second terminal coupled to the second liquid crystal capacitor Clcb, and a third terminal coupled to the step-down capacitor, an amount of charge in the second liquid crystal capacitor Clcb is partially charged in the step-down capacitor, thereby differently setting charging voltages of the first and second liquid crystal capacitors Clca and Clcb.

In addition, in the case of an LCD according to another exemplary embodiment, the first and second liquid crystal capacitors Clca and Clcb are respectively coupled to different data lines such that they are applied with different data voltages, thereby differently setting the charged voltages between the first and second liquid crystal capacitors Clca and Clcb.

Alternatively, using various different methods, the voltages charged in the first and second liquid crystal capacitors Clca and Clcb may be differently set.

Next, referring to FIGS. 2 and 3, a gate conductor including a gate line 121 and storage electrode lines 131 and 132 is disposed on a first insulation substrate 110 that is formed of transparent glass or plastic.

The gate line 121 includes gate electrodes 124a, 124b, and 124c, and a wide end portion (not shown) for contact with another layer or an external driving circuit.

The gate line 121 and the storage electrode lines 131 and 132 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), etc.

The gate line 121 may have a multilayer structure including at least two conductive layers having different physical properties.

The gate line 121 traverses a pixel area in a column direction.

A first subpixel electrode 191a for displaying a high gray may be disposed upward of the gate line 121, a second subpixel electrode 191b for displaying a low gray may be disposed downward thereof, and their positions can be interchanged.

The storage electrode lines 131 and 132 are formed of the same material as the gate line 121, and may be integrally formed with the gate line 121.

The first storage electrode line 131 disposed upward of the gate line 121 may have a quadrangular shape that encloses the first subpixel electrode 191a.

An uppermost side of the quadrangular shaped first storage electrode line 131 may be out of one pixel area such that it horizontally extends to be coupled to another layer or an external driving circuit.

The second storage electrode line 132 disposed downward of the gate line 121 includes a plurality of horizontal portions, and a plurality of vertical portions that interconnect the plurality of horizontal portions at edges thereof.

In the present specification, as described above, shapes of the storage electrode lines 131 and 132 are described and illustrated, but they are not limited thereto and may have any shapes for performing the same function.

A gate insulating layer 140 is disposed on the gate conductor.

A first semiconductor layer 154a, a second semiconductor layer 154b, and a third semiconductor layer 154c are disposed on the gate insulating layer 140.

A plurality of ohmic contacts including ohmic contacts 163a and 165a are disposed on the semiconductor layers 154a, 154b, and 154c, and may be omitted when the semiconductor layers 154a, 154b, and 154c are formed of an oxide semiconductor material.

A data line 171 including a source electrode, and a data conductor including a drain electrode and a divided reference voltage line 172, are formed on the ohmic contacts including the ohmic contacts 163a and 165a and the gate insulating layer 140.

The data conductor, the ohmic contacts, and the semiconductor layers disposed therebelow may be simultaneously formed using one mask.

FIG. 4 is a top plan view of a data conductor layer according to the exemplary embodiment.

The data conductor layer includes the data line 171, a first source electrode 173a, a second source electrode 173b, a third source electrode 173c, a first drain electrode 175a, a second drain electrode 175b, a third drain electrode 175c, and the divided reference voltage line 172.

The data line 171 extends in a row direction along an edge of one pixel area, and includes the first and second source electrodes 173a and 173b.

The first and second source electrodes 173a and 173b may have a U-shape, but they are not limited thereto.

The first drain electrode 175a faces the first source electrode 173a and has, as an example, an I-shape corresponding to the U-shaped first source electrode 173a, and includes a widely expanded region that is coupled to the first subpixel electrode 191a.

Similarly, the second drain electrode 175b faces the second source electrode 173b and has, as an example, an I-shape corresponding to the U-shaped second source electrode 173b, and includes as widely expanded region that is connected to the second subpixel electrode 191b.

The third source electrode 173c is formed to extend from one surface of the second drain electrode 175b.

In addition, the data conductor layer includes the divided reference voltage line 172, and the divided reference voltage line 172 includes the third drain electrode 175c that form the thin film transistor.

Referring to FIG. 4, the divided reference voltage line 172 includes a plurality of horizontal portions, and a plurality of vertical portions that interconnect the plurality of horizontal portions.

In the divided reference voltage line 172, the plurality of horizontal portions and the plurality of vertical portions for interconnecting them may be included such that the vertical portions are connected to one end of each of the horizontal portions that are parallel to each other.

As an example, when the first and second horizontal portions are connected by the vertical portion at their left sides, the second and third horizontal portions may be connected by the vertical portion at their right sides.

The divided reference voltage line 172 may be differently formed in the first and second subpixel electrodes 191a and 191b.

As shown in FIG. 4, the divided reference voltage line 172 disposed in the first subpixel electrode 191a may include two horizontal portions and one vertical portion, and the divided reference voltage line 172 disposed in the second subpixel electrode 191b may include three horizontal portions and two vertical portions.

This arrangement conforms to the shape of the pixel electrode 191, and a shape of the divided reference voltage line 172 may also be modified as the shape of pixel electrode 191 is modified.

In the divided reference voltage line 172, each vertical portion may be disposed to partially overlap ends of minute branch portions 197a and 197b, and each horizontal portion may be disposed to overlap vertical stem portions 194a and 194b of the pixel electrode 191.

In the divided reference voltage line 172 disposed in the first subpixel electrode 191a, a lowermost horizontal portion 177 may be partially branched downward to become the third drain electrode 175c.

The first gate electrode 124a, the first source electrode 173a, and the first drain electrode 175a that are described above form a first thin film transistor (TFT) Qa along with the first semiconductor layer 154a, and a channel of the first TFT Qa is formed in the first semiconductor layer 154a between the first source electrode 173a and the first drain electrode 175a.

Similarly, the second gate electrode 124b, the second source electrode 173b, and the second drain electrode 175b form a second TFT Qb along with the second semiconductor layer 154b, and a channel of the second TFT Qb is formed in the second semiconductor layer 154b between the second source electrode 173b and the second drain electrode 175b. The third gate electrode 124c, the third source electrode 173c, and the third drain electrode 175c form a third TFT Qc along with the third semiconductor layer 154c, and a channel of the third TFT Qc is formed in the third semiconductor layer 154c between the third source electrode 173c and the third drain electrode 175c.

A first passivation layer 180p is disposed on the data conductor layer and exposed portions of the semiconductor layers 154a, 154b, and 154c.

The first passivation layer 180p may be formed of a material such as a silicon nitride, a silicon oxide or the like that is used to form an inorganic insulating layer.

When a second passivation layer 180q serves as a color filter, the first passivation layer 180p prevents a pigment of the color filter from being introduced into the exposed semiconductor layers 154a, 154b, and 154c.

The second passivation layer 180q is disposed on the first passivation layer 180p and may be formed of the same material as the first passivation layer 180p, and may be omitted if necessary.

In addition, the second passivation layer 180q may serve as the color filter, as an example.

The second passivation layer 180q may uniquely display one of primary colors if it serves as the color filter, and the primary colors may be, for example, three primary colors such as red, green, and blue, or yellow, cyan, magenta, and the like.

Though not illustrated, a color filter for displaying mixed colors of the primary colors other than the primary colors or white may be further included.

A first contact hole 185a and a second contact hole 185b are disposed in the first and second passivation layers 180p and 180q to extend to and expose the first and second drain electrodes 175a and 175b.

The pixel electrode 191 is disposed on the second passivation layer 180q.

The pixel electrode 191 includes the first subpixel electrode 191a and the second subpixel electrode 191b, which interpose the gate line 121 therebetween to be separated from and to neighbor each other in the column direction.

The pixel electrode 191 may be formed of a transparent material such as ITO, IZO, etc.

The pixel electrode 191 may be formed of a transparent conductive material such as ITO or IZO, or a reflective metal such as aluminum, silver, chromium, or an alloy thereof.

A shielding electrode 199 formed of the same material as the pixel electrode 191 is disposed in the same layer as the pixel electrode 191 on the second passivation layer 180q.

The pixel electrode 191 and the shielding electrode 199 may be simultaneously formed using the same process.

The pixel electrode 191 and the shielding electrode 199 according to the inventive concept will be described with reference to FIG. 5.

First, the pixel electrode 191 includes, as described above, the first and second subpixel electrodes 191a and 191b.

The first subpixel electrode 191a includes a first horizontal stem portion 193a that extends in the column direction, the first vertical stem portion 194a that extends from one end of the first horizontal stem portion 193a in the row direction, and the plurality of first minute branch portions 197a that diagonally extend from opposite sides of the first horizontal stem portion 193a.

According to the exemplary embodiment, the first subpixel electrode 191a includes one first horizontal stem portion 193a.

In the first subpixel electrode 191a included in one pixel area, the first horizontal stem portion 193a is coupled to the first vertical stem portion 194a that is disposed at a right side of the first horizontal stem portion 193a and is perpendicular to one end thereof, and the first minute branch portions 197a extending from the first horizontal stem portion 193a obliquely extend in directions away from the first vertical stem portion 194a.

Some of the first minute branch portions 197a extending from the first horizontal stem portion 193a extend to form a wide region through which a voltage is supplied from the first drain electrode 175a that is exposed by the first contact hole 185a.

In FIG. 5 and the aforementioned description, the exemplary embodiment in which the first vertical stem portion 194a is disposed at the right side of one pixel area is described, but it is not limited thereto, and the exemplary embodiment in which it is disposed at a left side may also be possible.

A shape of the second subpixel electrode 191b is also similar to that of the first sub-pixel electrode 191a.

The second subpixel electrode 191b includes two second horizontal stem portions 193b that extend in the column direction, a second vertical stem portion 194b that is disposed at one end of the second horizontal stem portion 193b to be perpendicular thereto, and the plurality of second minute branch portions 197b that diagonally extend at opposite sides of each of the second horizontal stem portions 193b.

Some of the minute branch portions 197b extending from the horizontal stem portions 193b may be connected to each other.

In the second subpixel electrode 191b included in one pixel area, either one of the second horizontal stem portions 193b is coupled to the second vertical stem portion 194b that is disposed at the left side of the second horizontal stem portion 193b to be perpendicular to one end thereof.

In addition, the other one of the second horizontal stem portions 193b is coupled to the second vertical stem portion 194b that is disposed at a right side of the second horizontal stem portion 193b to be perpendicular to one end thereof.

That is, the second subpixel electrode 191b includes two second vertical stem portions 194b, and the two second vertical stem portions 194b may be respectively disposed at the left and right sides of one pixel area.

However, the inventive concept is not limited thereto, and the two second vertical stem portions may be disposed at the same side.

This will be described later.

The second minute branch portions 197b extending from the second horizontal stem portions 193b obliquely extend in directions away from the second vertical stem portions 194b.

Thus, according to the exemplary embodiment illustrated in FIG. 5, when the second vertical stem portion 194b is coupled to the second horizontal stem portion 193b such that it is disposed at the left side, the second minute branch portions 197b extend rightward.

On the contrary, when the second vertical stem portion 194b is coupled to the second horizontal stem portion 193b such that it is disposed at a right side of one pixel area, the minute branch portions 197b extend leftward.

That is, the minute branch portions 197b extending from the horizontal stem portions 193b are respectively directed in different directions.

Some of the second minute branch portions 197b extending from the second horizontal stem portion 193b extend to form a wide region through which a voltage is supplied from the second drain electrode 175*b* that is exposed by the second contact hole 185*b*.

Meanwhile, the first subpixel electrode 191*a* is divided into a plurality of subregions R1 and R2 by the first horizontal stem portion 193*a* and the first vertical stem portion 194*a*.

The first horizontal stem portion 193*a* and the first vertical stem portion 194*a* form a border between the adjacent subregions R1 and R2.

The first subpixel electrode 191*a* may further include the plurality of minute branch portions 197*a* that are disposed in each of the subregions R1 and R2.

The minute branch portions 197*a* of the different subregions R1 and R2 of the first subpixel electrode 191*a* may respectively extend in different directions.

Particularly, the minute branch portions 197*a* of the adjacent subregions R1 and R2 may form an angle of about 90° or 180°.

In each of the subregions R1 and R2, the minute branch portions 197*a* may extend in predetermined directions.

Specifically, among the subregions R1 and R2 defined by the first horizontal stem portion 193*a* and the first vertical stem portion 194*a*, the minute branch portions 197*a* of the upper subregion R1 may obliquely extend from the first horizontal stem portion 193*a* or the first vertical stem portion 194*a* in an upper left direction, and the minute branch portions 197*a* of the lower subregion R2 may obliquely extend from the first horizontal stem portion 193*a* or the first vertical stem portion 194*a* in a lower left direction.

Minute slits where a part of the electrode is removed are formed between the adjacent first minute branch portions 197*a*.

Widths of the minute branch portions 197*a* and the minute slits may be about 5 μm to 8 μm, but they are not limited thereto.

In addition, a ratio of the widths of the minute branch portions 197*a* to the widths of the minute slits may be about 1.5:1 to 1:1.5, but it is not limited thereto, and may be appropriately adjusted in consideration of display characteristics.

An acute angle formed between the first minute branch portions 197*a* and the first horizontal stem portion 193*a* may be about 40° to 45°, but it is not limited thereto, and may be appropriately adjusted in consideration of display characteristics such as visibility and the like of the LCD.

The second subpixel electrode 191*b* is divided into a plurality of subregions R1, R2, R3, and R4 by the second horizontal stem portion 193*b*, the second vertical stem portion 194*b*, and a gap.

The horizontal stem portions 193*b*, the vertical stem portions 194*b*, and the gap form a border between the adjacent subregions R1, R2, R3, and R4.

The second subpixel electrode 191*b* may further include the plurality of minute branch portions 197*b* that are formed in each of the subregions R1, R2, R3, and R4.

The minute branch portions 197*b* may obliquely extend from the second horizontal stem portion 193*b* or the second vertical stem portion 194*b* in the directions away therefrom.

The second minute branch portions 197*b* of the different subregions R1, R2, R3, and R4 of one second subpixel electrode 191*b* may respectively extend in different directions.

Particularly, the minute branch portions 197*b* of the adjacent subregions R1, R2, R3, and R4 may form an angle of about 90° or 180°.

In each of the subregions R1, R2, R3, and R4, the minute branch portions 197*b* may extend in predetermined directions.

Specifically, among the subregions R1, R2, R3, and R4 defined by the second horizontal stem portions 193*b* and the second vertical stem portions 194*b*, the minute branch portions 197*b* of the upper subregions R1 and R3 may obliquely extend from the second horizontal stem portion 193*b* or the second vertical stem portion 194*b* in an upper right or left direction, while the minute branch portions 197*b* of the lower subregions R2 and R4 may obliquely extend from the second horizontal stem portion 193*b*, or the second vertical stem portion 194*b* in a lower right or left direction.

An acute angle formed between the minute branch portions 197*b* and the second horizontal stem portion 193*b* may be about 40° to 45°, but it is not limited thereto, and may be appropriately adjusted in consideration of display characteristics such as visibility and the like of the LCD.

The aforementioned description made in relation to the first subpixel electrode 191 may identically be applied to other characteristics of each horizontal stem portion 193*b*, and each vertical stem portion 194*b*.

The shielding electrode 199 is disposed at an edge of one pixel to overlap the data line 171.

The shielding electrode 199 includes vertical portions 196 extending along the data line 171, and one or more horizontal portions 198 for interconnecting the neighboring vertical portions 196.

The horizontal portion 198 of the shielding electrode 199 may include an expanded region in the middle.

The shielding electrode 199 may be applied with the same voltage as a common electrode (not shown).

Accordingly, no electric field is generated between the shielding electrode 199 and the common electrode and thus liquid crystal molecules interposed therebetween are not arranged.

Therefore, the liquid crystal molecules between the shielding electrode 199 and the common electrode are in a black state.

As such, when the liquid crystal molecules display black, the liquid crystal molecules themselves may serve as a light blocking member.

Accordingly, in the display device according to the exemplary embodiment, the light blocking member that is disposed on the second insulation substrate to extend in the row direction may be omitted.

The upper panel (not shown) will now be described.

A light blocking member is disposed on a second insulation substrate that is formed of transparent glass or plastic and faces the first insulation substrate 110.

The light blocking member is referred to as a black matrix, and serves to prevent leakage of light.

The light blocking member according to the exemplary embodiment may extend in the column direction along the gate line 121.

A plurality of color filters are also disposed on the second insulation substrate.

When the second passivation layer 180*q* of the lower panel serves as the color filters, the color filter of the upper panel may be omitted.

In addition, the light blocking member of the upper panel may also be disposed in the lower panel.

An overcoat is disposed on the color filter and the light blocking member.

The overcoat may be formed of an (e.g., organic) insulating material, and prevents the color filter from being exposed and provides a smooth surface.

The overcoat may be omitted.

The common electrode is disposed on the overcoat.

The common electrode may be formed of the same material as the pixel electrode 191, and is formed to have a planar shape to be applied with the common voltage.

In addition, an alignment layer not shown) may be disposed on the pixel electrode 191 and the common electrode.

The liquid crystal layer is disposed between the lower panel and the upper panel.

The liquid crystal layer has negative dielectric anisotropy, and liquid crystal molecules of the liquid crystal layer are aligned such that their long axes are perpendicular to surfaces of the upper and lower display panels when no electric field is present.

The first and second subpixel electrodes 191a and 191b to which the data voltage is applied generate an electric field along with the common electrode of the upper panel, thereby determining the alignment directions of the liquid crystal molecules of the liquid crystal layer interposed between the pixel electrode 191 and the common electrode.

Depending on the directions of the liquid crystal molecules determined as such, luminance of light passing through the liquid crystal layer is controlled.

In the display device according to the exemplary embodiment, one pixel electrode includes the first subpixel electrode and the second subpixel electrode, the first subpixel electrode includes one horizontal stem portion, and the second subpixel electrode includes two horizontal stem portions.

As the display device has a higher resolution and thus a size of one pixel area is decreased, the display device may be allowed to have the minute branch portions or the stem portions of a predetermined number and size.

Accordingly, the display device has an advantage of reducing display abnormalities as well as controlling texture generated in the pixel area.

In addition, even if a curved display device is provided using the pixel electrodes extended from the horizontal stem portion, display abnormalities due to misalignment of the upper and lower substrates can be reduced.

A shape and arrangement of the pixel electrode according to another exemplary embodiment will now be described with reference to FIGS. 6 to 12.

FIGS. 6 to 12 are top plan views of pixel electrode layers according to further exemplary embodiments.

First, one pixel area illustrated in FIGS. 6 to 12 includes a first subpixel electrode 191a and a second subpixel electrode 191b.

The first subpixel electrode 191a includes one first horizontal stem portion 193a, minute branch portions 197a extending therefrom, and a first vertical stem portion 194a disposed at one end of the first horizontal stem portion 193a.

The second subpixel electrode 191b includes two second horizontal stem portions 193b, minute branch portions 197b extending therefrom, and two second vertical stem portions 194b disposed at each of one ends of the second horizontal stem portions 193b.

The minute branch portions 197a and 197b coupled to the first horizontal stem portion 193a and the second horizontal stem portions 193b respectively extend in directions that are determined by where the first and second vertical stem portions 194a and 194b are connected.

Thus, since a shape of a pixel electrode 191 is determined by where the first and second vertical stem portions 194a and 194b are disposed in one pixel area, and a plurality of exemplary embodiments according to where the first and second vertical stem portions 194a and 194b are disposed will now be described.

Figure 6:
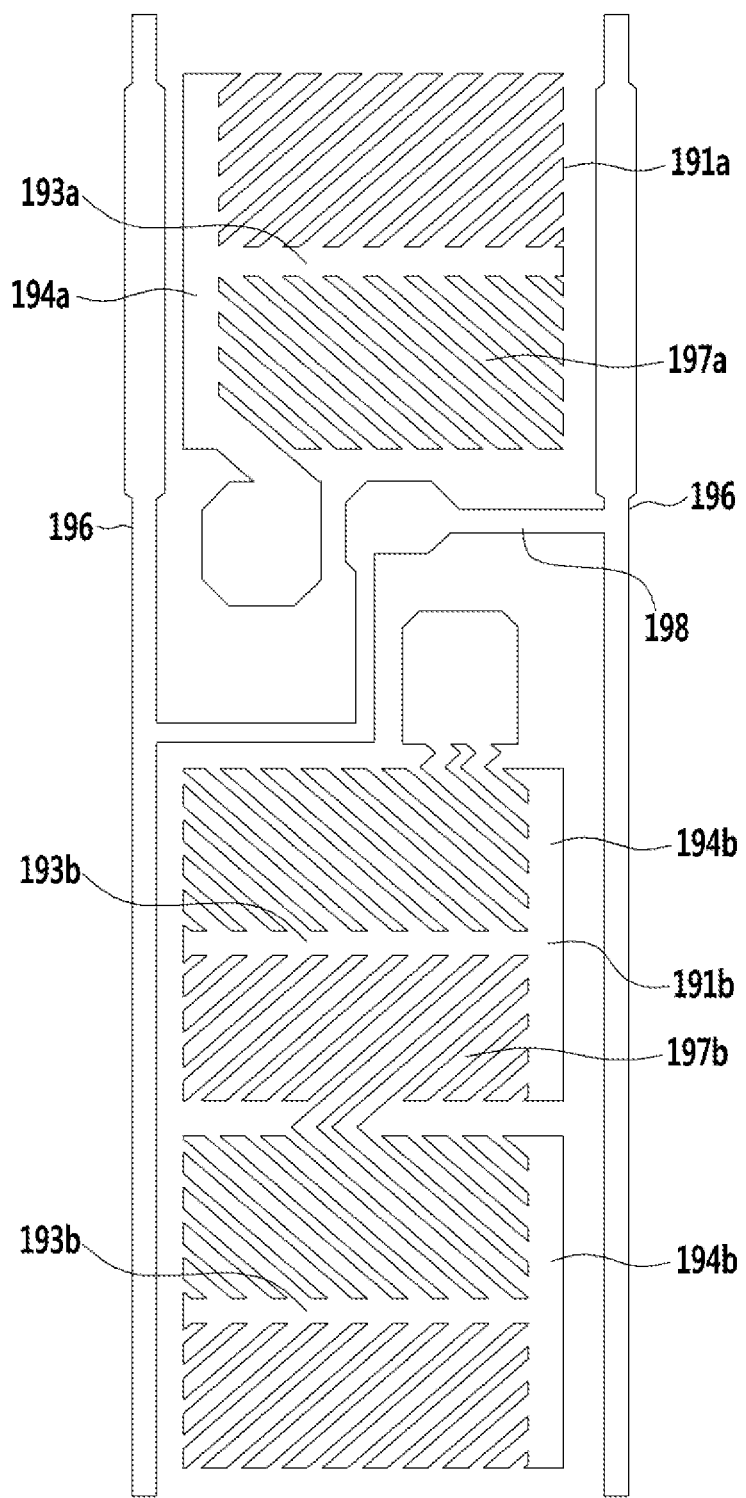
FIGS. 6, 7, 8, 9, 10, 11, and 12 are top plan views of pixel electrode layers according to further exemplary embodiments.

Referring first to FIG. 6, the first vertical stem portion 194a is disposed at a left edge of one pixel area, while two second vertical stem portions 194b are both disposed at a right edge thereof.

In addition, without being limited to the left and right edges, the first vertical stem portion 194a may be disposed at the right edge, while the two second vertical stem portions 194b may be disposed at the left edge thereof.

This is different from the previous exemplary embodiment in that the two second vertical stem portions 194b are disposed in the same side.

Figure 7:
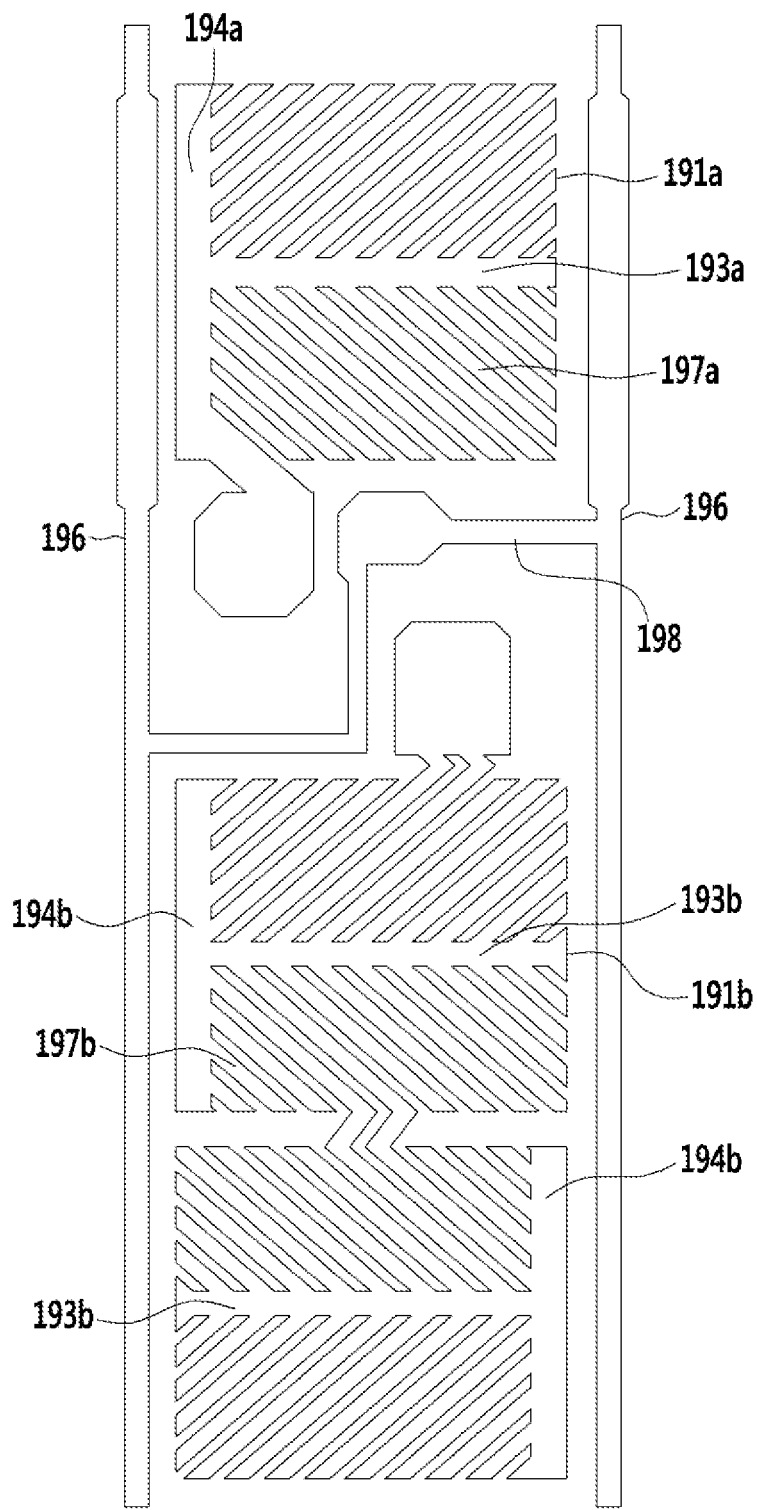

Next, referring to FIG. 7, a first vertical stem portion 194a is disposed at a left edge of one pixel area, and a second vertical stem portion 194b adjacent thereto is also disposed at the left edge.

That is, the first vertical stem portion 194a and the second vertical stem portion 194b adjacent thereto are disposed at the same side.

This is different from the exemplary embodiment of FIG. 6 in which they are alternately disposed.

In addition, the rest of the second vertical stem portions 194b positioned at the lowermost side of one pixel area may be disposed at a right edge as illustrated, but it is not limited thereto and they may be disposed at the left edge.

Figure 8:
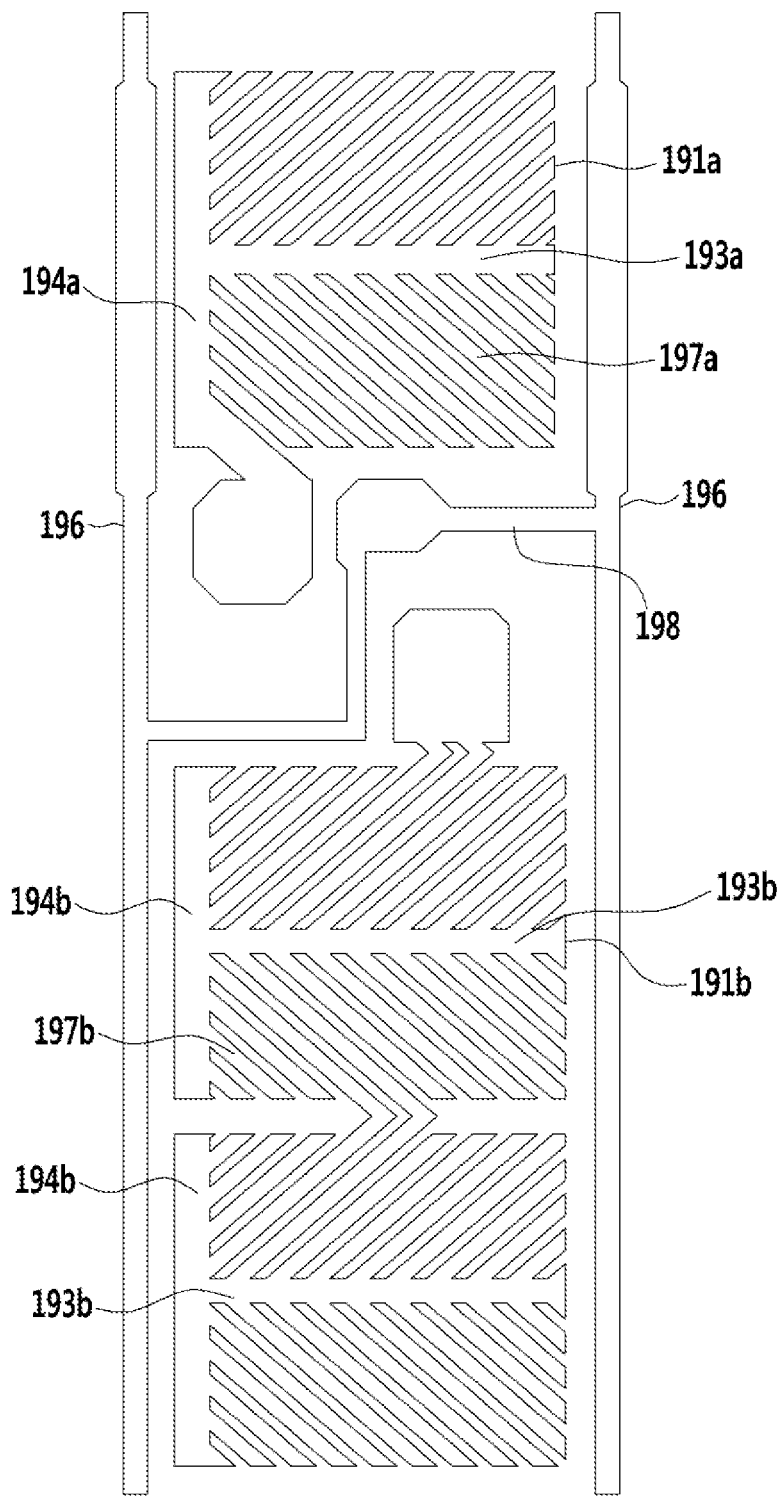

This is illustrated in FIG. 8.

That is, a first vertical stem portion 194a and a second vertical stem portion 194b adjacent in one pixel area may be alternately disposed, or may be disposed parallel to each other.

FIGS. 6 to 8 represent that when the first vertical stem portions 194a are disposed at the same side, the second vertical stem portion 194b adjacent thereto may be disposed at the same side or the opposite side based on the side where the first vertical stem portion 194a is disposed.

Figure 9:
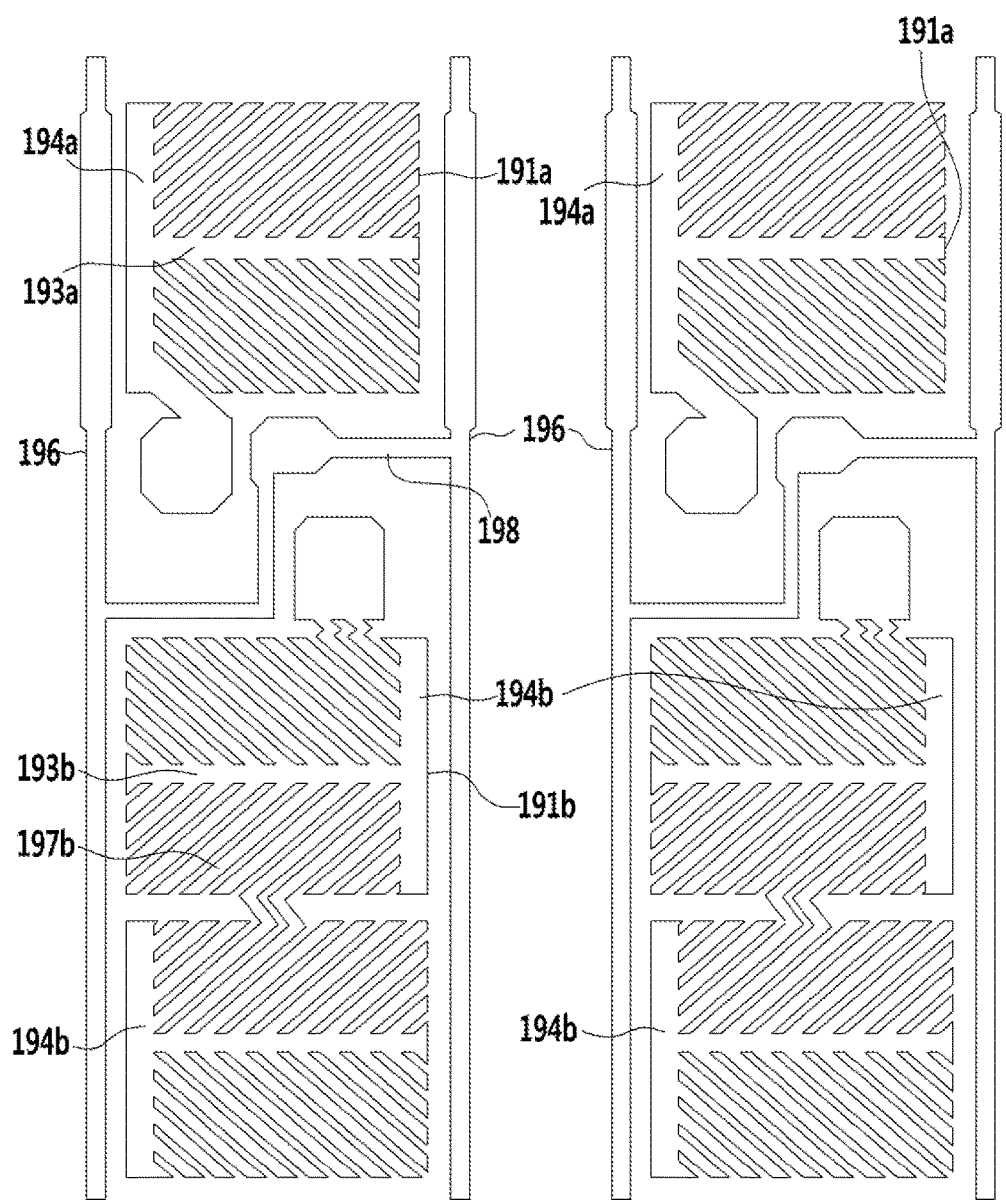

Next, referring to FIG. 9, first vertical stem portions 194a of two pixel areas adjacent in the column direction are arranged at the same positions relative to each other.

This represents that the first vertical stem portion disposed in an n-th column and the first vertical stem portion in an (n+1)-th column may be disposed at the same sides relative to each other.

In this case, n is a natural number of 1 or more.

In addition, when the first vertical stem portions of the two pixel areas adjacent in the column direction are disposed at the same sides, the second vertical stem portion may be disposed at any position.

As an example, a pixel area where the first vertical stem portion 194a is disposed at a left side, the second vertical stem portion 194b adjacent thereto is disposed at a right side, and the second vertical stem portion 194b disposed at a lowermost side is disposed at the left side is repeated.

They are not limited to being disposed at the left and right sides, and may also be interchanged in their positions.

Figure 10:
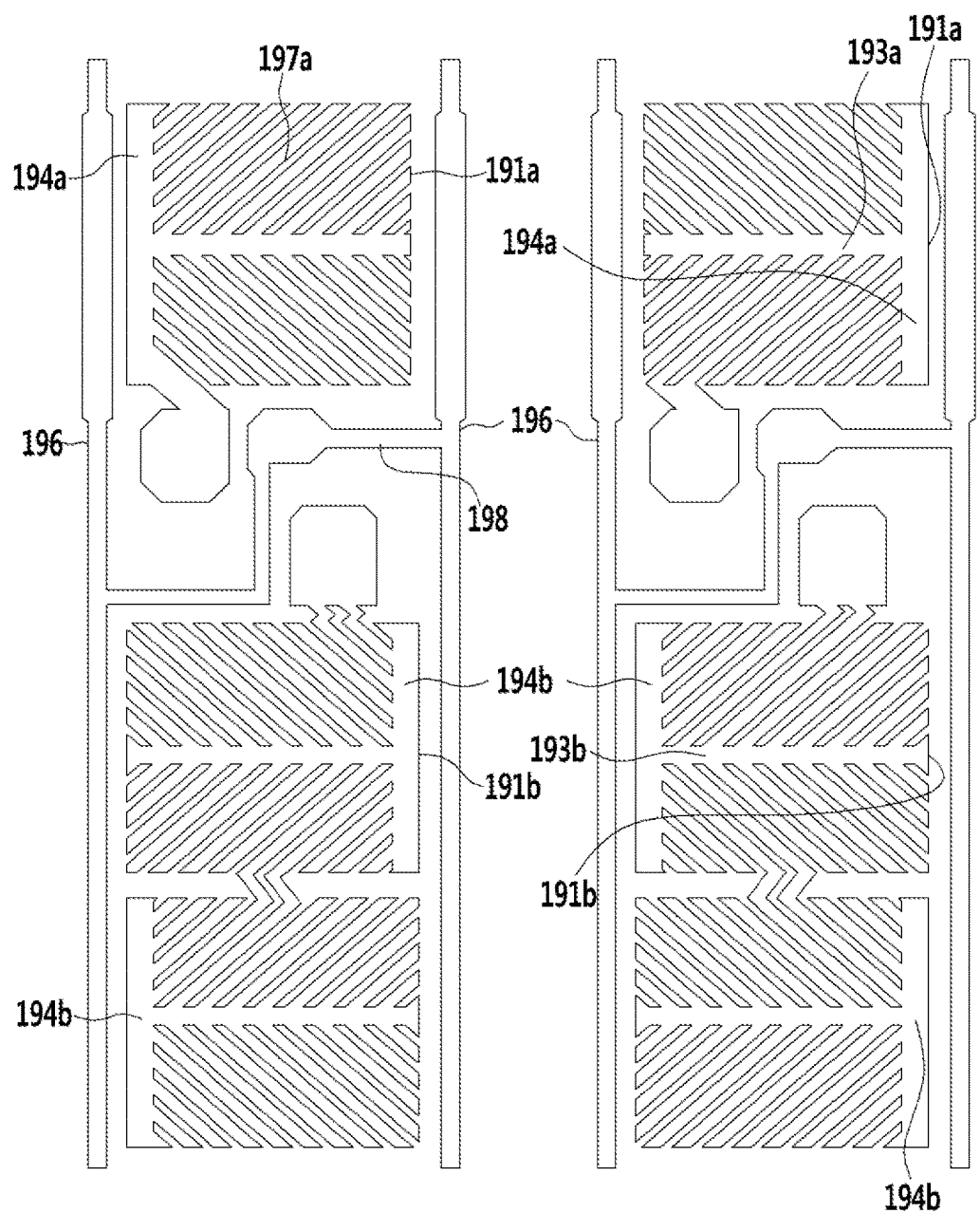

On the contrary, referring to FIG. 10, first vertical stem portions 194a of two pixel areas adjacent in the column direction are respectively arranged in different positions.

That is, when either one of the first vertical stem portions 194a of the two adjacent pixel areas is disposed at a left edge of one pixel area, the other one of the first vertical stem portions 194a may be disposed at a right edge of the other pixel area.

This represents that the first vertical stem portion disposed in an n-th column and the first vertical stem portion 194a disposed in an (n+1)-th column are disposed symmetrical to each other.

In this case, n is a natural number of 1 or more, and the second vertical stem portion 194b is not limited to being disposed in any position.

FIG. 9 and FIG. 10 represent that the first vertical stem portions 194a of the two pixel areas adjacent in the column direction may be disposed at the same side or respectively alternately disposed at different sides.

Figure 11:
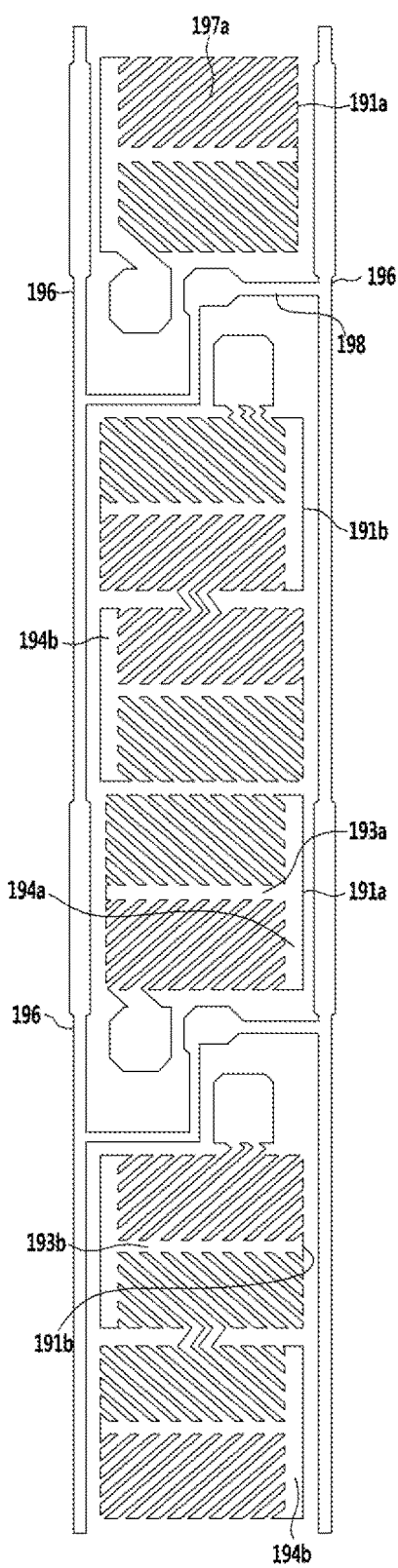
Figure 12:
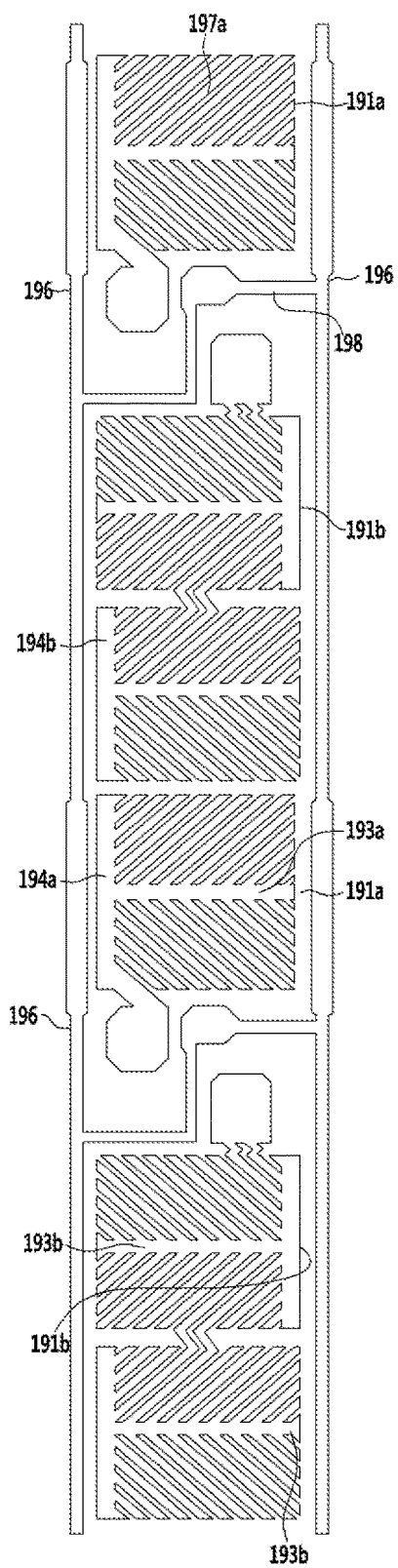

Next, referring to FIGS. 11 and 12, two pixel areas adjacent in the row direction, a second vertical stem portion 194b disposed at a lowermost end of the upper pixel area, and a first vertical stem portion 194a of the lower pixel area may be respectively alternately disposed in opposite sides or at the same side.

That is, in the upper pixel area as shown in FIG. 11, the second vertical stem portion 194b disposed at the lowermost end is disposed at a left edge, while the first vertical stem portion 194a of the other pixel area may be disposed at a right edge.

That is, the second vertical stem portion 194b disposed at an n-th row and the first vertical stem portion 194a disposed at an (n+1)-th row may be alternately disposed to be symmetrical to each other.

In this case, n is a natural number of 1 or more, and vertical stem portions except for the aforementioned vertical stem portions may be disposed at any sides.

On the contrary, according to an exemplary embodiment illustrated in FIG. 12, a second vertical stem portion 194b disposed at a lowermost end of an upper pixel area may be disposed at a left edge, while a first vertical stem portion 194a of a lower pixel area may also be disposed at the left edge.

That is, the second vertical stem portion 194b, disposed at an n-th row and the first vertical stem portion 194a disposed at an (n+1)-th row may be disposed parallel to each other.

In this case, n is a natural number of 1 or more, and vertical stem portions except for the aforementioned vertical stem portions may be disposed at any sides.

As described above, the vertical stem portions are described such that they are disposed at the left side or right side as illustrated in the drawings, but they are not limited thereto, and their positions may be interchanged and a combination of the aforementioned exemplary embodiments may also be possible.

Circuit diagrams according to further exemplary embodiments will now be described with reference to FIGS. 13 to 16.

Shapes of gate and data lines illustrated in FIGS. 2 to 4 may be modified as shown in FIGS. 13 to 16, which represents that pixel arrangements of FIGS. 13 to 16 having the shapes of the aforementioned pixel electrodes is possible.

Figure 13:
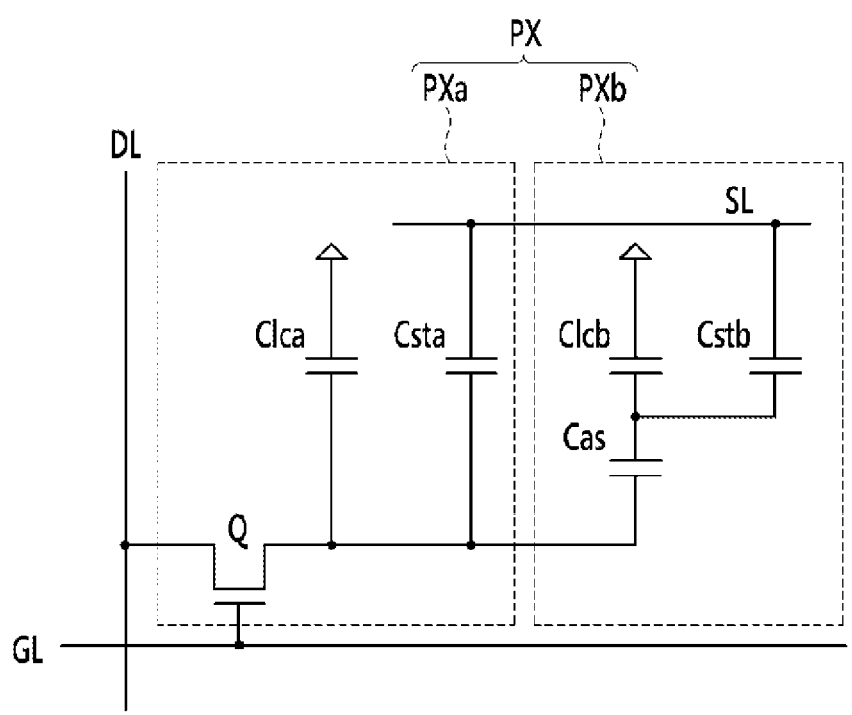
FIGS. 13, 14, 15, and 16 are circuit diagrams of one pixel according to further exemplary embodiments.

An exemplary embodiment of FIG. 13 will now be described.

An LCD according to the exemplary embodiment includes: signal lines including a plurality of gate lines GL, a plurality of data lines DL, and a plurality of storage electrode lines SL; and a plurality of pixels PX coupled thereto.

Each pixel PX includes a pair of first and second subpixels PXa and PXb, and a first subpixel electrode is formed in the first subpixel PXa while a second subpixel electrode is formed in the second subpixel PXb.

The LCD according to the exemplary embodiment further includes: a switching element Q coupled to the gate line GL and the data line DL; a first storage capacitor Csta and a first liquid crystal capacitor Clca that are coupled to the switching element Q to be formed in the first subpixel PXa; a second liquid crystal capacitor Clcb and a second storage capacitor Cstb that are coupled to the switching element Q to be formed in the second subpixel PXb; and an auxiliary capacitor Cas that is formed between the switching element Q and the second liquid crystal capacitor Clcb.

The switching element Q is a three-terminal element such as a thin film transistor and the like that is provided in a lower panel, a control terminal thereof is coupled to the gate line GL, an input terminal thereof is coupled to the data line DL, and an output terminal thereof is coupled to the first liquid crystal capacitor Clca, the first storage capacitor Csta, and the auxiliary capacitor Cas.

One terminal of the auxiliary capacitor Gas is coupled to the output terminal of the switching element Q while the other terminal thereof is coupled to the second liquid crystal capacitor Clcb and the second storage capacitor Cstb.

A charged voltage of the second liquid crystal capacitor Clcb is decreased by the auxiliary capacitor Gas such that it is lower than a charged voltage of the first liquid crystal capacitor Clca, thereby improving side visibility of the LCD.

Figure 14:
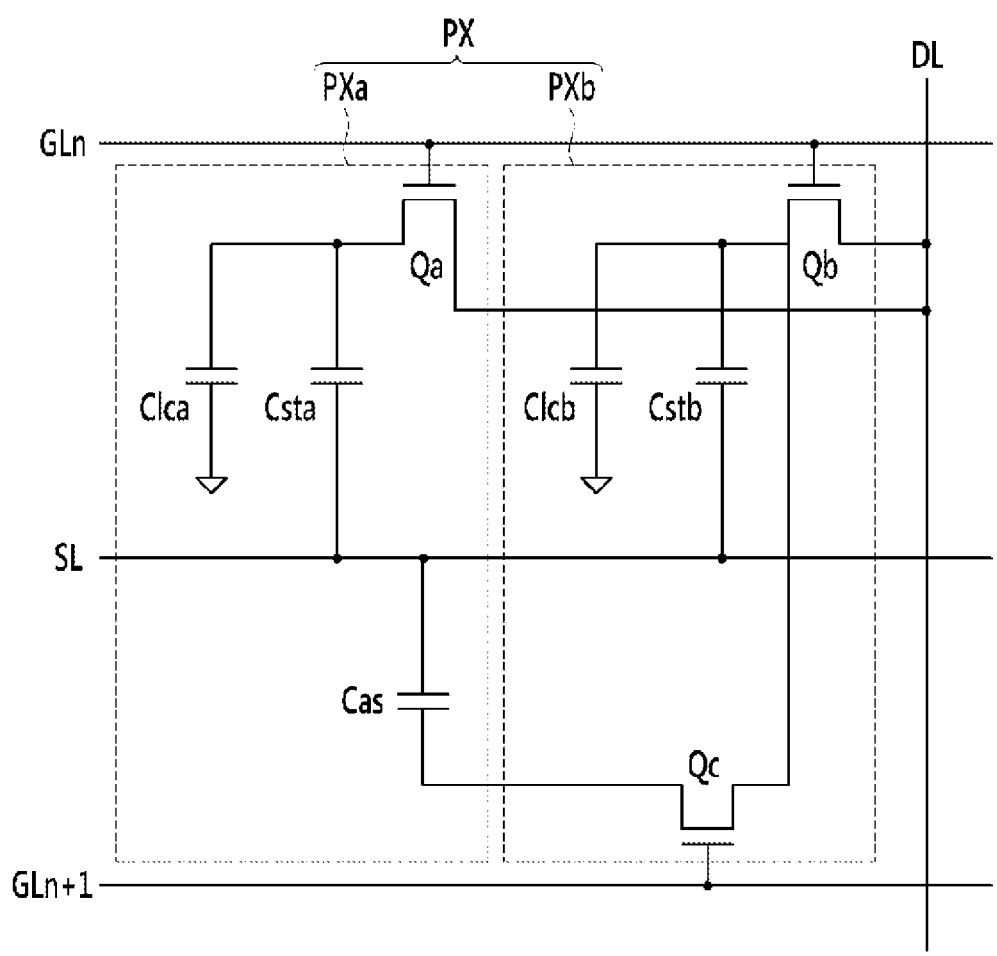

An exemplary embodiment of FIG. 14 will now be described.

An LCD according to the exemplary embodiment includes: signal lines including a plurality of gate lines GLn and GL(n+1), a plurality of data lines DL, and a plurality of storage electrode lines SL; and a plurality of pixels PX coupled thereto.

Each pixel PX includes a pair of first and second subpixels PXa and PXb, and a first subpixel electrode is formed in the first subpixel PXa while a second subpixel electrode is formed in the second subpixel PXb.

The LCD according to the exemplary embodiment includes: a first switching element Qa and a second switching element Qb that are coupled to the gate line GLn and the data line DL; a first liquid crystal capacitor Clca and a first storage capacitor Csta that are coupled to the first switching element Qa to be formed in the first subpixel PXa; a second liquid crystal capacitor Clcb and a second storage capacitor Cstb that are coupled to the second switching element Qb to be formed in the second subpixel Pxb; a third switching element Qc that is coupled to the second switching element Qb to be switched by the next gate line GL(n+1); and an auxiliary capacitor Cas that is coupled to the third switching element Qc.

The first and second switching elements Qa and Qb are three-terminal elements such as thin film transistors and the like that are provided in a lower panel, control terminals thereof are coupled to the gate line GLn, input terminals thereof are coupled to the data line DL, and output terminals thereof are respectively coupled to the first liquid crystal capacitor Clca and the first storage capacitor Csta as well as the second liquid crystal capacitor Clcb and the second storage capacitor Cstb.

The third switching element Qc is also a three-terminal element such as a thin film transistor and the like that is provided in the lower panel, a control terminal thereof is coupled to the next gate line GL(n+1), an input terminal thereof is coupled to the second liquid crystal capacitor Clcb, and an output terminal thereof is coupled to the auxiliary capacitor Cas.

One terminal of the auxiliary capacitor Cas is coupled to the output terminal of the third switching element Qc, while the other terminal thereof is coupled to the storage electrode line SL.

An operation of the LCD according to the exemplary embodiment will now be described. When a gate-on voltage is applied to the gate line GLn, the first and second switching elements Qa and Qb connected thereto are turned on, and a data voltage of the data line DL is applied to the first and second subpixel electrodes.

Next, when a gate-off voltage is applied to the gate line GLn and the gate-on voltage is then applied to the next gate line GL(n+1), the first and second switching elements Qa and Qb are turned off and the third switching element Qc is turned on.

Accordingly, charges of the second subpixel electrode coupled to the output terminal of the second switching element Qb flow into the auxiliary capacitor Cas, thereby causing the voltage of the second liquid crystal capacitor Clcb to be decreased.

As such, the charged voltages of the first and second liquid crystal capacitors Clca and Clcb can be differently set to improve side visibility of the liquid crystal display.

Figure 15:
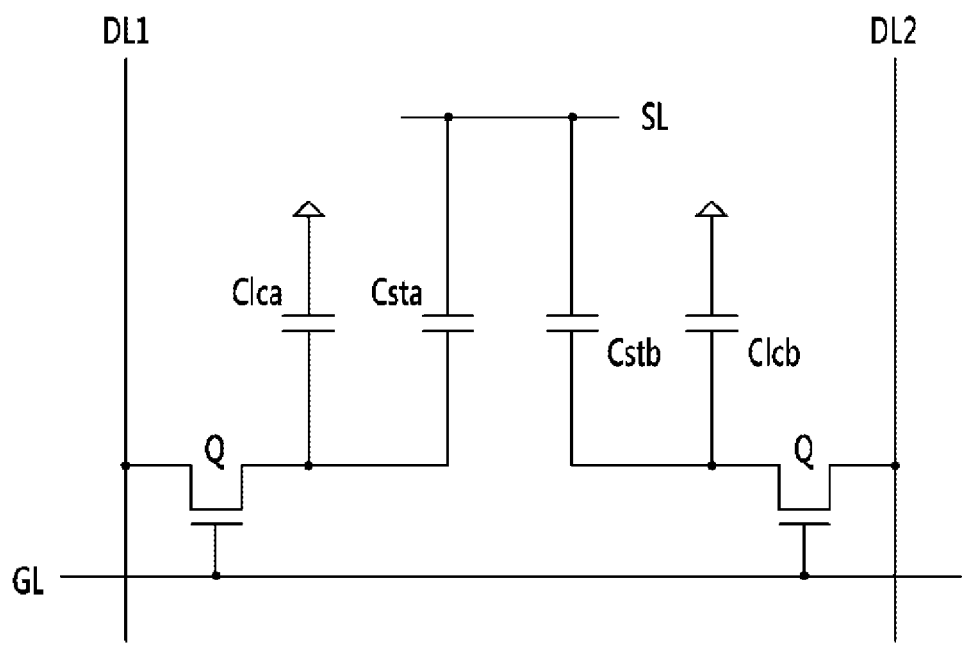

An exemplary embodiment of FIG. 15 will now be described.

An LCD according to the exemplary embodiment includes: signal lines including a plurality of gate lines GL, a plurality of data lines DL1 and DL2, and a plurality of storage electrode lines SL; and a plurality of pixels coupled thereto.

Each pixel includes a pair of first and second liquid crystal capacitors Clca and Clab, and first and second storage capacitors Csta and Cstb.

Each subpixel includes one liquid crystal capacitor and one storage capacitor, and additionally includes one thin film transistor.

The thin film transistors Q of the two subpixels included in one pixel are coupled to the same gate line GL but are respectively coupled to the different data lines DL1 and DL2.

Data voltages of different levels are simultaneously applied to the different data lines DL1 and DL2 such that the first and second liquid crystal capacitors Clca and Clcb of the two subpixels have the different charged voltages.

Thus, side visibility of the LCD can be improved.

An exemplary embodiment of FIG. 16 will now be described.

Figure 16:
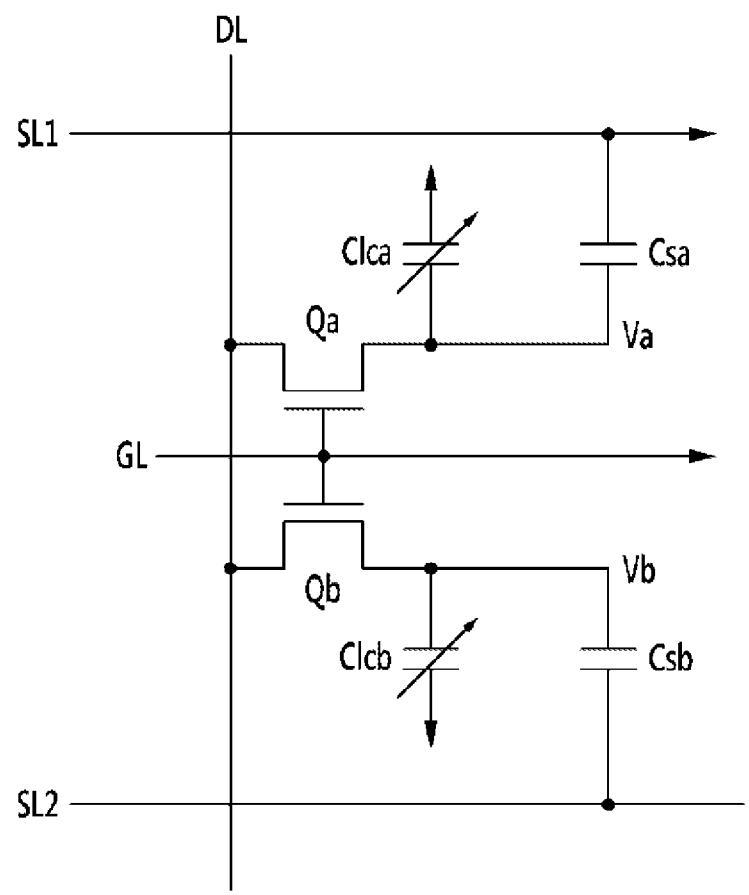

As shown in FIG. 16, an LCD according to the exemplary embodiment, includes: a gate line GL; a data line DL; a first power line SL1; a second power line SL2; and a first switching element Qa and a second switching element Qb that are coupled to the gate line GL and the data line DL.

The LCD according to the exemplary embodiment further includes an auxiliary step-up capacitor Csa and a first liquid crystal capacitor Clca that are coupled to the first switching element Qa, and an auxiliary step-down capacitor Csb and a second liquid crystal capacitor Clcb that are coupled to the second switching element Qb.

The first and second switching elements Qa and Qb are three-terminal elements such as thin film transistors and the like.

The first and second switching elements Qa and Qb are coupled to the same gate and data lines GL and DL to be turned on at the same time, thereby outputting the same data signal.

The first and second power lines SL1 and SL2 are applied with a voltage that can be swung for a predetermined period.

A first low voltage is applied to the first power line SL1 for the predetermined period (e.g., 1H), and a first high voltage is applied thereto for the next predetermined period.

A second high voltage is applied to the second power line SL2 for the predetermined period, and a second low voltage is applied thereto for the next predetermined period.

In this case, the first period and the second period are repeated multiple times in one frame such that the voltage that can be swung is applied to the first and second power lines SL1 and SL2.

In this case, the first low voltage and the second low voltage may be identical to each other, and the first high voltage and the second high voltage may also be identical to each other.

The auxiliary step-up capacitor Csa is coupled to the first switching element Qa and the first power line SL1, and the auxiliary step-down capacitor Csb is coupled to the second switching element Qb and the second power line SL2.

A voltage Va of a terminal (hereinafter referred to as a "first terminal") of a part of the auxiliary step-up capacitor Csa coupled to the first switching element Qa is decreased when the first low voltage is applied to the first power line SL1, and is increased when the first high voltage is applied thereto.

Subsequently, as the voltage of the first power line SL1 is swung, the voltage Va of the first terminal is also swung.

In addition, a voltage Vb of a terminal (hereinafter referred to as a "second terminal") of a part of the auxiliary step-down capacitor Csb coupled to the second switching element Qb is increased when the second high voltage is applied to the second power line SL2, and is decreased when the second low voltage is applied thereto.

Subsequently, as the voltage of the second power line SL2 is swung, the voltage Vb of the second terminal is also swung.

As such, even if the same data voltage is applied to the two subpixels, the voltages Va and Vb of the pixel electrodes of the two subpixels are changed depending on the swung voltages of the first and second power lines SL1 and SL2, thereby improving side visibility as well as making transmittances of the two subpixels different.

In the exemplary embodiments of FIGS. 13 to 16, a reference voltage line is not used, but by using any line parallel to the data line formed to traverse a center of a display area of a pixel, display quality can be improved.

According to the display device described above, the curved display device in which a display abnormality due to misalignment of the upper and lower substrates is reduced can be provided.

In addition, the display device of a high resolution having an advantage of easily controlling the generated texture even if a size of the pixel area is decreased can be provided.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

| <Description of Symbols> | |
| --- | --- |
| 121: gate line | 124a, 124b, 124c: gate electrode |
| 140: gate insulating layer | 171: data line |

-continued

<Description of Symbols>

| | |
|---|---|
| 173a, 173b, 173c: source electrode | 175a, 175b, 175c: drain electrode |
| 180p, 180q: passivation layer | 191: pixel electrode |
| 191a: first subpixel electrode | 191b: second subpixel electrode |

What is claimed is:

1. A display device comprising:
a first insulation substrate;
a thin film transistor disposed on the first insulation substrate; and
a pixel electrode coupled to the thin film transistor;
wherein the pixel electrode includes a first subpixel electrode that is divided into two regions configured to arrange liquid crystal molecules while including one first horizontal stem portion, and a second subpixel electrode that includes a plurality of second horizontal stem portions vertically offset from one another and a plurality of minute branch portions extending from the plurality of the second horizontal stem portions, and
wherein the plurality of minute branch portions connected to different second horizontal stem portions do not overlap each other along a horizontal direction.

2. The display device of claim 1, wherein the first and second subpixel electrodes respectively include the plurality of minute branch portions that diagonally extend from the first and second horizontal stem portions.

3. The display device of claim 2, wherein some of the minute branch portions extending from the plurality of second horizontal stem portions are connected to each other.

4. The display device of claim 1, wherein the second subpixel electrode includes two second horizontal stem portions.

5. The display device of claim 4, wherein the first subpixel electrode includes a first vertical stem portion that is disposed at one end of the first horizontal stem portion, and the second subpixel electrode includes a second vertical stem portion that is disposed at one end of the second horizontal stem portions.

6. The display device of claim 5, wherein the first vertical stem portion disposed at an n-th column and the first vertical stem portion disposed at an (n+1)-th column are symmetrical to each other, wherein the n is a natural number of 1 or more.

7. The display device of claim 5, wherein the first vertical stem portion disposed at an n-th column and the first vertical stem portion disposed in an (n+1)-th column are disposed at the same side, wherein the n is a natural number of 1 or more.

8. The display device of claim 5, wherein the first and second vertical stem portions adjacent in one pixel area are alternately disposed.

9. The display device of claim 5, wherein the first and second vertical stem portions adjacent in one pixel area are disposed parallel to each other.

10. The display device of claim 5, wherein the second vertical stem portion disposed at an n-th row and the first vertical stem portion disposed at an (n+1)-th row are alternately disposed, wherein the n is a natural number of 1 or more.

11. The display device of claim 5, wherein the second vertical stem portion disposed at an n-th row and the first vertical stem portion disposed at an (n+1)-th row are disposed parallel to each other, wherein the n is a natural number of 1or more.

12. The display device of claim 1, wherein
the thin film transistor includes:
a gate line that is disposed on the first insulation substrate while including a gate electrode;
a semiconductor layer disposed on the gate line;
a data line including a source electrode; and
a drain electrode, wherein the source and drain electrodes are disposed on the semiconductor layer.

13. The display device of claim 12, further comprising a gate insulating layer disposed on the gate line, and a passivation layer disposed on the data line and the drain electrode.

14. The display device of claim 1, wherein the display device is a curved type.

15. The display device of claim 1, wherein the second subpixel electrode is divided into four regions configured to arrange liquid crystal molecules.

* * * * *